(12) United States Patent
Mao et al.

(10) Patent No.: US 10,389,230 B2
(45) Date of Patent: Aug. 20, 2019

(54) POWER SEMICONDUCTOR DEVICE AND SNUBBER CIRCUIT THEREOF

(71) Applicant: General Electric Company, Schenectady, NY (US)

(72) Inventors: Saijun Mao, Shaghai (CN); Stefan Schroeder, Bavaria (DE); Jingkui Shi, Shanghai (CN); He Xu, Shaghai (CN); Marius Michael Mechlinski, Garching (DE); Bo Qu, Shanghai (CN); Zhihui Yuan, Garching (DE); Yingqi Zhang, Shanghai (CN); Jie Shen, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/903,710

(22) Filed: Feb. 23, 2018

(65) Prior Publication Data

US 2018/0287487 A1 Oct. 4, 2018

(30) Foreign Application Priority Data

Mar. 31, 2017 (CN) .......................... 2017 1 0206579

(51) Int. Cl.
*H02M 1/34* (2007.01)
*H03K 17/0814* (2006.01)
(Continued)

(52) U.S. Cl.
CPC .............. *H02M 1/34* (2013.01); *H02M 3/158* (2013.01); *H03K 17/08142* (2013.01);
(Continued)

(58) Field of Classification Search
CPC .......... H02M 1/32; H02M 1/34; H02M 3/155; H02M 3/158; H02M 2001/344;
(Continued)

(56) References Cited

U.S. PATENT DOCUMENTS

| 3,242,395 A | 3/1966 | Goldman et al. |
| 5,343,098 A | 8/1994 | Miyasaka |

(Continued)

FOREIGN PATENT DOCUMENTS

| EP | 0 834 982 A2 | 4/1998 |
| EP | 2 276 158 A1 | 1/2011 |
| JP | 6028764 A | 2/1985 |

OTHER PUBLICATIONS

C K Campbell et al., "Steady-state and transient C-V response of a high-voltage nonlinear barium titanate ceramic-disc power-snubber capacitor", Electronic Components and Technology Conference, 1992. Proceedings., 42nd, p. 607-610, May 18-20, 1992, San Diego, CA.

(Continued)

*Primary Examiner* — Adolf D Berhane
(74) *Attorney, Agent, or Firm* — Wood IP LLC

(57) ABSTRACT

The present disclosure relates to a snubber circuit which comprises a static snubber unit, connected in parallel with the switch, for balancing a static voltage sharing across a switch when the switch is in a state of turn-on or turn-off; and a dynamic snubber unit for balance a dynamic voltage sharing across the switch when the switch is in a process of turn-on or turn-off, comprising a dynamic voltage sharing capacitor connected in parallel with the switch and having a relationship between a capacitance and a voltage of the dynamic voltage sharing capacitor; and a controller for controlling the capacitance of the dynamic voltage sharing capacitor to be in a predetermined working area of capacitance rising while the voltage across the switch is increasing. The present disclosure also relates to a power semiconductor device.

8 Claims, 4 Drawing Sheets

(51) Int. Cl.
*H03K 17/10* (2006.01)
*H02M 3/158* (2006.01)

(52) U.S. Cl.
CPC ..... *H03K 17/102* (2013.01); *H02M 2001/344* (2013.01); *H02M 2001/348* (2013.01)

(58) Field of Classification Search
CPC ..... H02M 2001/342; H02M 2001/346; H02M 2001/348; H02M 3/202; H02H 3/20; H02H 3/202
See application file for complete search history.

(56) References Cited

U.S. PATENT DOCUMENTS

| | | | |
|---|---|---|---|
| 5,491,624 A * | 2/1996 | Levran | H02M 7/219 363/44 |
| 5,550,730 A | 8/1996 | Seki | |
| 7,319,579 B2 | 1/2008 | Inoue et al. | |
| 8,362,529 B2 | 1/2013 | Lin et al. | |
| 9,065,326 B2 | 6/2015 | Hafner et al. | |
| 2010/0327963 A1* | 12/2010 | Taubman | G05F 1/10 327/551 |
| 2011/0309795 A1* | 12/2011 | Firehammer | H02J 7/0014 320/118 |
| 2012/0026758 A1* | 2/2012 | Lee | H02M 3/33576 363/21.13 |
| 2012/0242391 A1 | 9/2012 | Fan | |
| 2013/0235626 A1* | 9/2013 | Jang | H02M 1/4216 363/37 |
| 2014/0225439 A1 | 8/2014 | Mao | |

OTHER PUBLICATIONS

T Funaki et al., "Measuring Terminal Capacitance and Its Voltage Dependency for High-Voltage Power Devices", IEEE Transactions on Power Electronics, vol. 24, Issue: 6, p. 486-1493, Jun. 2009.
Extended European Search Report and Opinion issued in connection with corresponding EP Application No. 18162917.1 dated Aug. 21, 2018.

* cited by examiner

POWER SEMICONDUCTOR DEVICE AND SNUBBER CIRCUIT THEREOF

BACKGROUND

Embodiments of the present disclosure relate to a power semiconductor device and a snubber circuit thereof, and more particularly to a power semiconductor device and a snubber circuit for balancing voltage among series-connected switching devices.

In high voltage applications, serialization with low voltage devices instead of using high voltage devices is a good solution for low cost. However, voltage balance of each serialized power semiconductor device is a big problem. Such blocking voltage unbalance among serialized devices may cause some devices holding much higher blocking voltage than the others and may greatly increase the failure rate of devices. The voltage unbalance is mainly caused by propagation delay mismatch of gating signals and the performance variation among serialized devices. These factors may also vary with component manufacturing, temperature, aging etc. To attenuate the effect, a conventional snubber circuit providing with a capacitor for decreasing a voltage between both ends of each serialized power semiconductor device is commonly used to balance the voltage of serialized devices. However, the capacitance of the capacitor used in the conventional snubber circuit will decrease quite a lot when the voltage applied to the capacitor increases so that the capacitor must have a high breakdown voltage structure, such as combining with additional snubber capacitors with fixed big capacitance, which increases the cost and size.

Therefore, it would be desirable if a power semiconductor device and a snubber circuit could be provided to achieve a voltage balancing for power semiconductor device serialization at least with low cost and simple configuration.

BRIEF DESCRIPTION

In accordance with one embodiment disclosed herein, a snubber circuit for a switch is provided. The snubber circuit comprises a static snubber unit, connected in parallel with the switch, for balancing a static voltage sharing across a switch when the switch is in a state of turn-off; and a dynamic snubber unit for balance a dynamic voltage sharing across the switch when the switch is in a process of turn-on or turn-off, comprising a dynamic voltage sharing capacitor connected in parallel with the switch and having a relationship between a capacitance and a voltage of the dynamic voltage sharing capacitor; and a controller for controlling the capacitance of the dynamic voltage sharing capacitor to be in a predetermined working area of capacitance rising while the voltage across the switch is increasing.

In accordance with another embodiment disclosed herein, a power semiconductor device is provided. The power semiconductor device comprises at least two series-connected switches; and at least two snubber circuits as described above. Each of the at least two snubber circuits is connected in parallel with each of the at least two series-connected switches.

DRAWINGS

These and other features and aspects of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

Figure 1:
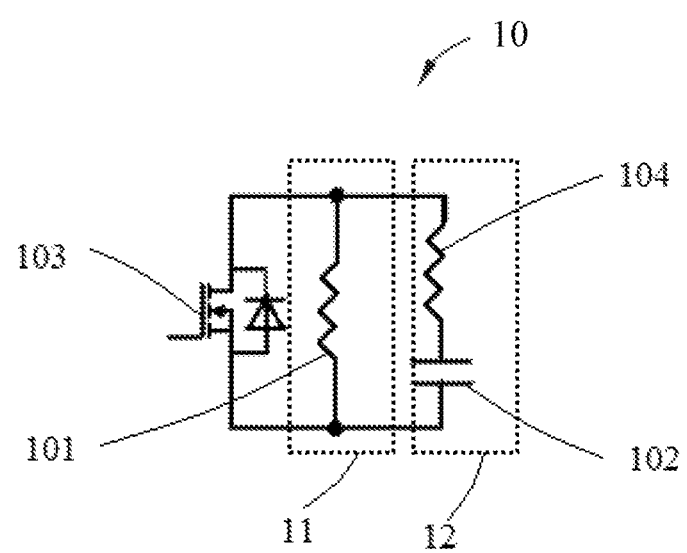
FIG. 1 is a circuit diagram of a switch module according to one embodiment.

Referring to FIG. 1, a circuit diagram of a switch module 10 according to one embodiment is shown. The switch module 10 may include a switch 103. The switch 103 can be, without limitation, Insulated Gate Bipolar Transistors (IGBT), Integrated Gate Commutated Thyristor (IGCT), Metal-Oxide-Semiconductor Field Effect Transistors (MOSFET), Injection Enhanced Gate Transistors (IEGT), SiC MOSFET, or any other controllable power switch.

In this illustrated embodiment, a snubber circuit is provided for both static and dynamic voltage sharing for the switch 103. The snubber circuit is placed across the switch 103 which is to be protected.

In one embodiment, the snubber circuit includes a static snubber unit 11 connected in parallel to the switch 103. As an example of the static snubber unit 11, at least one static voltage sharing resistor 101 is provided for balancing a static voltage sharing across the switch 103. The static voltage sharing resistor 101 in the static snubber unit 11 has a smaller resistance than that of the switch 103. When the switch 103 is in a state of turn-off, the voltage across the switch 103 will be shared by the static snubber unit 11, i.e., the static snubber unit 11 adjusts the voltage across the switch 103 so as to achieve a static voltage balance.

In this illustrated embodiment, the snubber circuit further includes a dynamic snubber unit 12. The dynamic snubber unit 12 includes a dynamic voltage sharing capacitor 102 connected in parallel to the switch 103. The dynamic snubber unit 12 further includes a controller (not shown). The controller controls the capacitance of the dynamic voltage sharing capacitor 102 to be in a predetermined working area of capacitance rising while the voltage across the switch 103 is increasing during the switching process.

Figure 3:
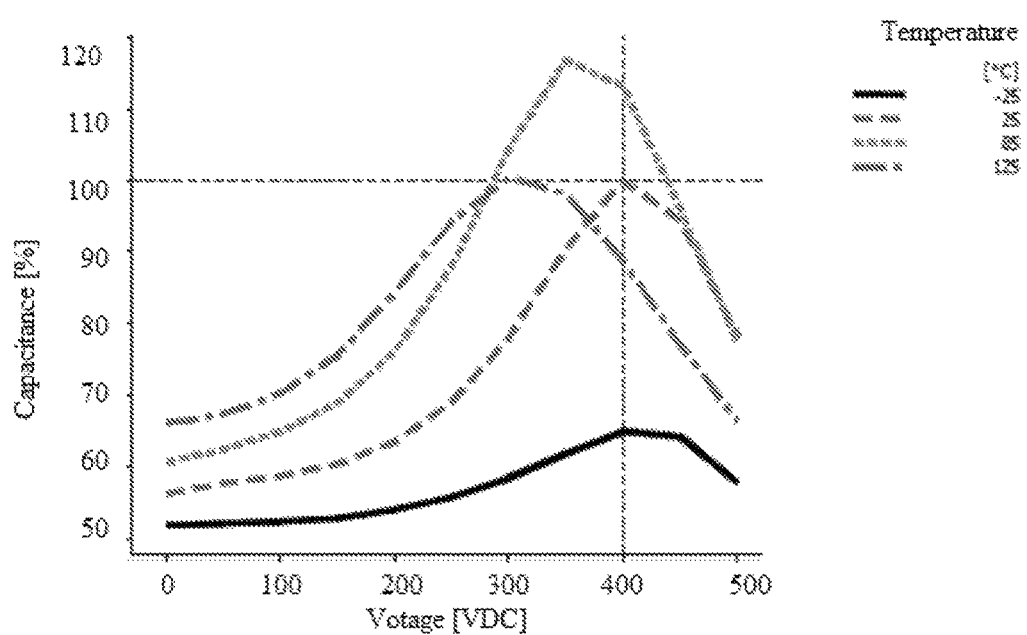
FIG. 3 is a diagram illustrating the relationship between the capacitance of the dynamic voltage sharing capacitor and the voltage across the capacitor according to one embodiment.

As shown in FIG. 3, there is a typical relationship between the capacitance of the dynamic voltage sharing capacitor 102 and the voltage across the capacitor 102 within a broad range of temperature from −25° C. to 125° C. The capacitance of the capacitor 102 increases while the voltage rises from 0 V. Once the voltage reaches a particular value, such as 400 V at the temperature of 25° C., the capacitance of the capacitor 102 decreases while the voltage continuously rises. The predetermined working area for the capacitor 102 will be from a low voltage to a voltage corresponding to the maximum capacitance so as to ensure the capacitor 102 exhibits increasing effective capacitance with rising voltage. In one embodiment, the dynamic voltage sharing capacitor 102 is controlled to operate in a range of capacitance rising of 0 nF to 100 nF. The controller may be any type of programmable devices, such as a micro-controller, a micro control unit (MCU), a digital signal processor (DSP), etc.

Figure 4:
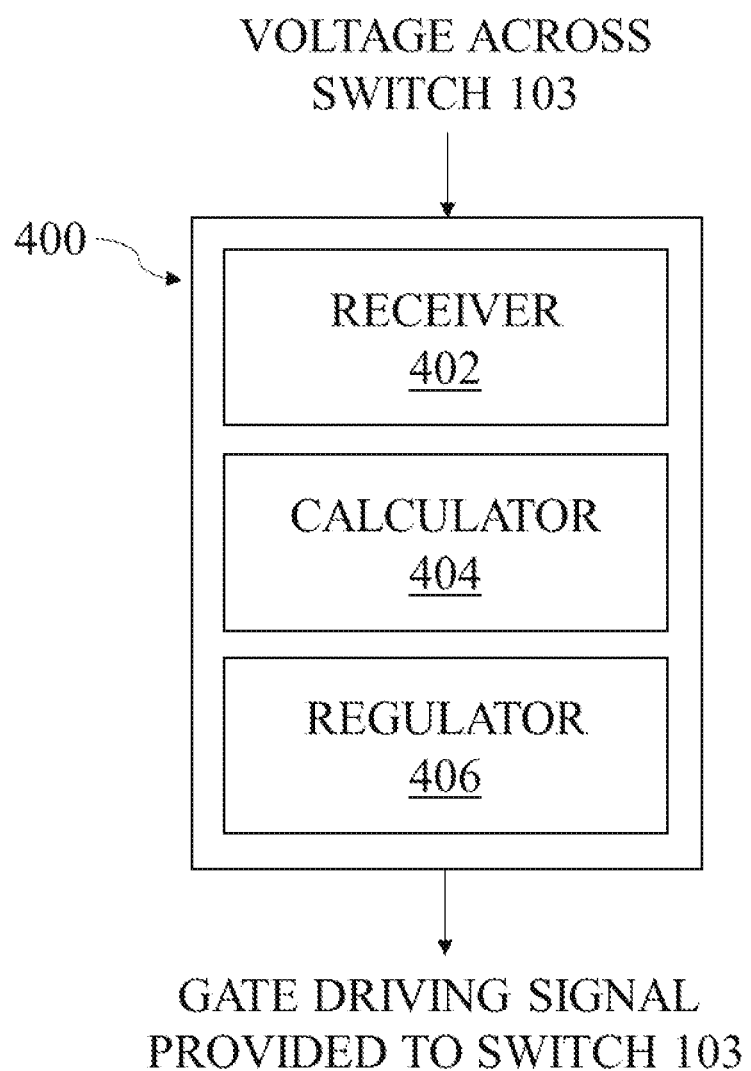
FIG. 4 is a diagram illustrating a controller according to an embodiment.

In one embodiment depicted in FIG. 4, the controller 400 includes a receiver 402, a calculator 404, and a regulator 406. The receiver 402 is configured for receiving a voltage across the switch 103. The calculator 404 is configured for determining a capacitance of the dynamic voltage sharing capacitor 102 based on the received voltage across the switch 103 from the relationship between the capacitance and the voltage of the dynamic voltage sharing capacitor. The relationship between the capacitance and the voltage of the dynamic voltage sharing capacitor may be saved in the controller 400 in advance. The regulator 406 is configured for regulating a gate driving signal provided to the switch 103 so that the capacitance of the dynamic voltage sharing capacitor is in the predetermined working area if the determined capacitance of the dynamic voltage sharing capacitor 102 exceeds the scope of the predetermined working area. For example, when the voltage across the switch 103 reaches about 450 V at the temperature of 25° C., the capacitance of the dynamic voltage sharing capacitor 102 will go down to be a 90% value instead of a higher value than 100%, which cannot share enough voltage for the switch 103. In this circumstance, the regulator 406 will have the gate driving signal provided to the switch 103 delayed so as to have the voltage across the switch 103 go down within 400 V. Then, the capacitor 102 may be operated in the predetermined working area of capacitance rising while the voltage is increasing.

During the switching process, the dynamic voltage sharing capacitor 102 across the switch 103 with high voltage stress will exhibit high capacitance. It enables the total impedance of the switch 103 with high voltage stress to become small. As a result, the voltage across the switch 103 is shared by the dynamic voltage sharing capacitor 102. Thus, the voltage stress can be mitigated automatically for dynamic voltage sharing during the switching process.

In this illustrated embodiment, the dynamic snubber unit 12 may further include a damping resistor 104. The damping resistor 104 is connected in series with the dynamic voltage sharing capacitor 102 for damping current oscillations across the switch 103 during the switching process. For illustration purpose, only one damping resistor 104 is shown in FIG. 1. The number of the damping resistor 104 included may be set according to particular applications.

Figure 2:
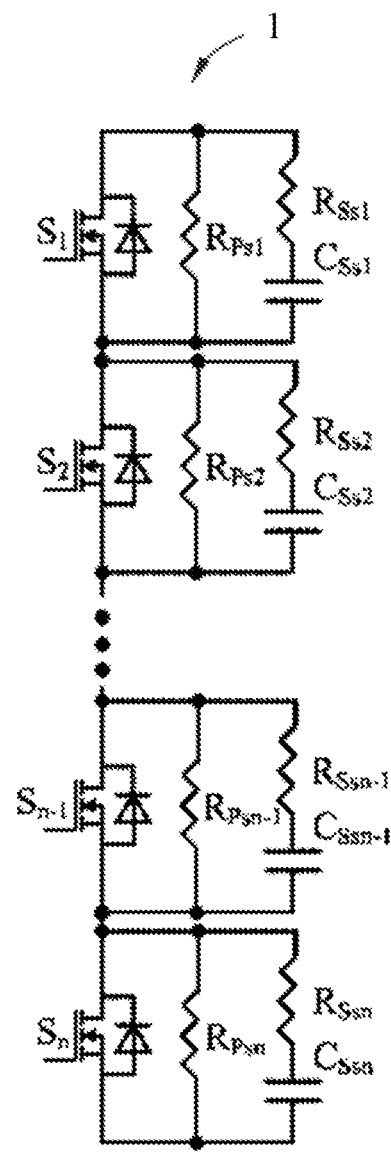
FIG. 2 is a circuit diagram of a power semiconductor device according to one embodiment.

Referring to FIG. 2, a circuit diagram of a power semiconductor device 1 according to one embodiment is shown. The illustrated embodiment shows an exemplary power semiconductor device 1 which includes a plurality of series-connected switches $S_1, S_2, \ldots, S_{n-1}, S_n$. Each switch $S_1, S_2, \ldots, S_{n-1}, S_n$ has a similar snubber circuit as described above. Specifically, each switch $S_1, S_2, \ldots, S_{n-1}, S_n$ which is to be protected is placed with a separate snubber circuit. Each snubber circuit includes a static voltage sharing resistor $Rp_{s1}, Rp_{s2}, \ldots, Rp_{sn-1}, Rp_{sn}$ connected in parallel to the switch $S_1, S_2, \ldots, S_{n-1}, S_n$ for balancing a static voltage sharing across the switch $S_1, S_2, \ldots, S_{n-1}, S_n$ when it is in the state of turn-off, i.e., is in a steady state. Furthermore, each snubber circuit includes a dynamic voltage sharing capacitor $Cs_{s1}, Cs_{s2}, \ldots, Cs_{sn-1}, Cs_{sn}$ connected in parallel to the switch $S_1, S_2, \ldots, S_{n-1}, S_n$ for balancing a dynamic voltage sharing across the switch $S_1, S_2, \ldots, S_{n-1}, S_n$ during it turns on or turns off, i.e., is in a dynamic state. In one embodiment, the capacitance of the dynamic voltage sharing capacitor $Cs_{s1}, Cs_{s2}, \ldots, Cs_{sn-1}, Cs_{sn}$ is controlled to be in a predetermined working area of capacitance rising while the voltage across the switch $S_1, S_2, \ldots, S_{n-1}, S_n$ is increasing during the switching process. Moreover, each snubber circuit may include a damping resistor $Rs_{s1}, Rs_{s2}, \ldots, Rs_{sn-1}, Rs_{sn}$, connected in series with the dynamic voltage sharing capacitor $Cs_{s1}, Cs_{s2}, \ldots, Cs_{sn-1}, Cs_{sn}$ for damping current oscillations across the switch $S_1, S_2, \ldots, S_{n-1}, S_n$ during the switching process.

For illustration purpose, a plurality of switches $S_1, S_2, \ldots, S_{n-1}, S_n$ are shown in FIG. 2, but the power semiconductor device 1 may include two or more than two series connected switches in particular applications.

The voltage across the switches $S_1, S_2, \ldots, S_{n-1}, S_n$ with high voltage stress will be decreased under the affection of the snubber circuit as described above. Then the voltage stress can be mitigated automatically for dynamic voltage sharing during the switching process. Therefore, the voltage balancing of the power semiconductor device can be achieved. Moreover, thanks to the controlled capacitance of the dynamic voltage sharing capacitor $Cs_{s1}, Cs_{s2}, Cs_{sn-1}, Cs_{sn}$, the dynamic voltage sharing capacitor $Cs_{s1}, Cs_{s2}, Cs_{sn-1}, Cs_{sn}$, attenuates the overvoltage very effectively. As a result, additional snubber capacitors, such as the capacitors with fixed big capacitance, are not necessary.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

What is claimed is:

1. A snubber circuit for a switch, comprising:
   a static snubber unit, connected in parallel with the switch, for balancing a static voltage sharing across the switch when the switch is in a state of turn-on or turn-off; and
   a dynamic snubber unit for balance a dynamic voltage sharing across the switch when the switch is in a process of turn-on or turn-off, comprising:
      a dynamic voltage sharing capacitor connected in parallel with the switch and having a relationship between a capacitance and a voltage of the dynamic voltage sharing capacitor; and
      a controller for controlling the capacitance of the dynamic voltage sharing capacitor to be in a predetermined working area of capacitance rising while the voltage across the switch is increasing, the controller comprising:
         a receiver for receiving a voltage across the switch;
         a calculator for determining the capacitance of the dynamic voltage sharing capacitor based on the received voltage across the switch from the relationship between the capacitance and the voltage of the dynamic voltage sharing capacitor; and
         a regulator for regulating a gate driving signal provided to the switch so that the capacitance of the dynamic voltage sharing capacitor is in the predetermined working area when the determined capacitance of the dynamic voltage sharing capacitor exceeds the predetermined working area.

2. The snubber circuit of claim 1, wherein the dynamic voltage sharing capacitor is controlled to operate in a range of 0 nF to 100 nF.

3. The snubber circuit of claim 1, wherein the dynamic snubber unit further comprises:
- a damping resistor, connected in series with the dynamic voltage sharing capacitor, for damping current oscillations across the switch.

4. The snubber circuit of claim 1, wherein the static snubber unit comprises at least one static voltage sharing resistor.

5. A power semiconductor device, comprising:
- at least two series-connected switches; and
- at least two snubber circuits, wherein each of the at least two snubber circuits is connected in parallel with one of the at least two series-connected switches and each of the at least two snubber circuits comprises:
  - a static snubber unit, connected in parallel with the switch, for balancing a static voltage sharing across the switch when the switch is in a state of turn-on or turn-off; and
  - a dynamic snubber unit for balance a dynamic voltage sharing across the switch when the switch is in a process of turn-on or turn-off, comprising:
    - a dynamic voltage sharing capacitor connected in parallel with the switch and having a relationship between a capacitance and a voltage of the dynamic voltage sharing capacitor; and
    - a controller for controlling the capacitance of the dynamic voltage sharing capacitor to be in a predetermined working area of capacitance rising while the voltage across the switch is increasing, the controller comprising:
      - a receiver for receiving a voltage across the switch;
      - a calculator for determining the capacitance of the dynamic voltage sharing capacitor based on the received voltage across the switch; and
      - a regulator for regulating a gate drive signal provided to the switch when the determined capacitance of the dynamic voltage sharing capacitor exceeds the predetermined working area.

6. The power semiconductor device of claim 5, wherein the dynamic voltage sharing capacitor is controlled to operate in a range of 0 nF to 100 nF.

7. The power semiconductor device of claim 5, wherein the dynamic snubber unit further comprises:
- a damping resistor, connected in series with the dynamic voltage sharing capacitor, for damping current oscillations across the switch.

8. The power semiconductor device of claim 5, wherein the static snubber unit comprises at least one static voltage sharing resistor.

* * * * *